United States Patent
Håff et al.

(10) Patent No.: US 9,693,088 B2
(45) Date of Patent: *Jun. 27, 2017

(54) DISTANCE BASED RENDERING OF MEDIA FILES

(71) Applicant: Sony Mobile Communications AB, Lund (SE)

(72) Inventors: Olle Håff, Umeå (SE); Fredrik Johansson, Malmö (SE)

(73) Assignees: Sony Corporation, Tokyo (JP); Sony Mobile Communications, Inc., Tokyo (JP)

( * ) Notice: Subject to any disclaimer, the term of this patent is extended or adjusted under 35 U.S.C. 154(b) by 48 days.

This patent is subject to a terminal disclaimer.

(21) Appl. No.: 14/538,986

(22) Filed: Nov. 12, 2014

(65) Prior Publication Data

US 2015/0058871 A1    Feb. 26, 2015

Related U.S. Application Data

(63) Continuation of application No. 13/271,586, filed on Oct. 12, 2011, now Pat. No. 8,917,877.

(51) Int. Cl.
*H03G 3/00* (2006.01)
*H04N 21/41* (2011.01)
(Continued)

(52) U.S. Cl.
CPC ... *H04N 21/4126* (2013.01); *H04N 21/42222* (2013.01); *H04N 21/43615* (2013.01);
(Continued)

(58) Field of Classification Search
CPC ..... H03G 3/001; H03G 3/002; H04R 2420/07
(Continued)

(56) References Cited

U.S. PATENT DOCUMENTS 7,409,064 B2 * 8/2008 Watanuki ................. G11C 7/16
                                                     381/311
7,696,887 B1 * 4/2010 Echavarria ......... G08B 21/0227
                                                    340/573.1
(Continued)

FOREIGN PATENT DOCUMENTS

EP        2073192 A1    6/2009

OTHER PUBLICATIONS

IBM, "Television Package Roaming Profiles", The IP.com Journal, IP.com Inc., pp. 1-5, May 29, 2009, West Henrietta, New York, XP013132006.
(Continued)

*Primary Examiner* — Disler Paul
(74) *Attorney, Agent, or Firm* — Coats & Bennett, PLLC

(57) ABSTRACT

A rendering device dynamically varies how audio and visual information is rendered by a rendering device responsive to changes in distance between the rendering device and a mobile device carried by a user. As the user moves about, the distance between the rendering device and the mobile device carried by the user will vary. As the distance between the mobile device and the rendering device changes, the rendering system can dynamically adapt how the audio and visual information is rendered. For example, the rendering device can increase or decrease the volume of an audio output, depending on changes in the distance. Also, the rendering device can change how visual information is rendered on a display responsive to changes in distance. In some embodiments, when the distance between the mobile device and rendering device exceeds a predetermined distance, the audio and/or visual information may be sent to the mobile device.

14 Claims, 3 Drawing Sheets

(51) Int. Cl.
*H04N 21/422* (2011.01)
*H04N 21/436* (2011.01)
*H04N 21/4402* (2011.01)
*H04N 21/485* (2011.01)

(52) U.S. Cl.
CPC . *H04N 21/440263* (2013.01); *H04N 21/4852* (2013.01); *H04N 21/4858* (2013.01); *H03G 3/001* (2013.01); *H04R 2420/07* (2013.01)

(58) Field of Classification Search
USPC .................. 381/74, 58–59, 104–109, 77, 79
See application file for complete search history.

(56) References Cited

U.S. PATENT DOCUMENTS

| | | | | |
|---|---|---|---|---|
| 8,457,557 | B2* | 6/2013 | Alden | H04L 63/0492 455/41.2 |
| 8,682,004 | B2 | 3/2014 | Grigsby | |
| 2002/0109601 | A1* | 8/2002 | Arens | G08B 13/1427 340/573.1 |
| 2004/0196985 | A1* | 10/2004 | Kokubo | C23C 14/0063 381/79 |
| 2005/0229200 | A1 | 10/2005 | Kirkland et al. | |
| 2007/0124775 | A1 | 5/2007 | DaCosta | |
| 2008/0085686 | A1 | 4/2008 | Kalik | |
| 2010/0156624 | A1* | 6/2010 | Hounsell | G08B 21/24 340/539.1 |
| 2011/0164188 | A1 | 7/2011 | Karaoguz et al. | |
| 2011/0181780 | A1 | 7/2011 | Barton | |
| 2012/0020486 | A1* | 1/2012 | Fried | H03G 3/32 381/58 |
| 2012/0020487 | A1 | 1/2012 | Fried | |
| 2012/0128172 | A1* | 5/2012 | Alden | H04L 63/0492 381/77 |
| 2013/0028443 | A1* | 1/2013 | Pance | G06F 3/167 381/107 |

OTHER PUBLICATIONS

Chiao, H., et al., "Video Everywhere Through a Scalable IP-Streaming Service Framework", 3rd International Symposium on Wireless Communication Systems, IEEE, pp. 190-194, Sep. 1, 2006, XP031152056.

Mate, S., et al., "Movable-Multimedia: Session Mobility in Ubiquitous Computing Ecosystem", Proceedings of the 5th International Conference on Mobile and Ubiquitous Multimedia, MUM 2006, vol. 193, Art. 8, pp. 1-5, Dec. 4-6, 2006, Stanford, California, XP055019030.

* cited by examiner

DISTANCE BASED RENDERING OF MEDIA FILES

RELATED APPLICATION

The present application is a continuation application of U.S. patent application Ser. No. 13/271,586, which was filed on Oct. 12, 2011, and which is incorporated by reference herein in its entirety.

BACKGROUND

In recent years, there has been tremendous growth in the use of smart phones and tablet computers. One reason for the popularity of such devices is that they free the user from tethers to fixed communication networks and allow the user to remain in communication with others while moving freely about. For example, users can use smart phones and tablet computers to send and receive emails, chat with friends, and browse web pages without a fixed connection to communications networks.

Smart phones and tablet computers are commonly used as rendering devices to play audio and/or videos. Docking systems with built-in speakers and/or displays, or connections to sound and video systems, are now commonly used for playing audio and video stored in smart phones and tablet computers. In this scenario, the speakers and/or video screens are likely to be at fixed locations. As the user moves away from the docking station, attenuation of sound may cause changes in the perceived volume. Further, if visual information is output to a display screen on the smart phone, tablet computer, or docking station, the user's ability to see the information diminishes as the user moves away from the docking station.

Accordingly, there is a need for adapting the manner in which audio and/or video is rendered depending on the distance between a user and the rendering device.

SUMMARY

The present invention provides a method and apparatus for dynamically varying how audio and visual information is rendered by a rendering device responsive to changes in a user's location. A rendering device is configured to monitor a distance between the rendering device and a mobile device that is presumably carried by a user. As the user moves about, the distance between the rendering device and the mobile device carried by the user will vary. As the distance between the mobile device and the rendering device changes, the rendering system can dynamically adapt how the audio and visual information is rendered. For example, the rendering device can increase or decrease the volume of an audio output, depending on changes in the distance. Also, the rendering device can change how visual information is rendered on a display responsive to changes in distance. In some embodiments, when the distance between the mobile device and rendering device exceeds a predetermined distance, the audio and/or visual information may be redirected to the mobile device.

Exemplary embodiments of the invention comprise a method implemented at by rendering device for rendering a media file. In one exemplary embodiment of the method, the rendering device monitors a distance between the rendering device and a mobile device while the media file is being rendered, and dynamically varies how the media file is rendered responsive to changes in the distance between the rendering device and the mobile device.

In some embodiments of the method, the media file comprises audio output to a speaker associated with the rendering device, and the rendering device varies a volume of the audio output by the speaker.

In some embodiments of the method, the media file comprises an image or text displayed on a display associated with the rendering device, and wherein the rendering device varies the size of the displayed image or text.

In some embodiments of the method, the media file comprises a still image or video image displayed on a display associated with the rendering device, and wherein the rendering device varies a zoom level for the displayed image.

In some embodiments of the method, the media file comprises a still image or video image displayed on a display associated with the rendering device, and wherein the rendering device varies a resolution of the displayed image.

In some embodiments of the method, the media file comprises a web page displayed on a display associated with the rendering device, and wherein the rendering device varies a page layout for the displayed the web page.

Some embodiments of the method further comprise outputting audio associated with the media file to a mobile device when the distance is greater than a predetermined distance for output by the mobile device.

Some embodiments of the method further comprise outputting an image associated with the media file to a mobile device when the distance is greater than a predetermined distance for output by the mobile device.

Other embodiments of the invention comprise a rendering device for rendering a media file. One embodiment of the rendering device comprises a distance monitoring circuit for monitoring a distance between the rendering device and a mobile device while the media file is being rendered; and a rendering circuit for dynamically varying how the media file is rendered responsive to changes in the distance between the rendering device and the mobile device.

In some embodiments, the media file comprises audio output to a speaker associated with the rendering device, and the rendering circuit is configured to vary a volume of the audio output by the speaker.

In some embodiments, the media file comprises an image or text displayed on a display associated with the rendering device, and the rendering circuit is configured to vary the size of the displayed image or text.

In some embodiments, the media file comprises a still image or video image displayed on a display associated with the rendering device, and the rendering circuit is configured to vary a zoom level for the displayed image.

In some embodiments, the media file comprises a still image or video image displayed on a display associated with the rendering device, and the rendering circuit is configured to vary a resolution of the displayed image.

In some embodiments, the media file comprises a web page displayed on a display associated with the rendering device, and wherein the rendering circuit is configured to vary a page layout for the displayed web page.

In some embodiments, the rendering device further comprises a wireless transceiver for sending audio associated with the media file to a speaker on the mobile device when the distance is greater than a predetermined distance.

In some embodiments, the rendering device further comprises a wireless transceiver for sending an image associated with the media file to a display on the mobile device when the distance is greater than a predetermined distance.

DETAILED DESCRIPTION

Figure 1:
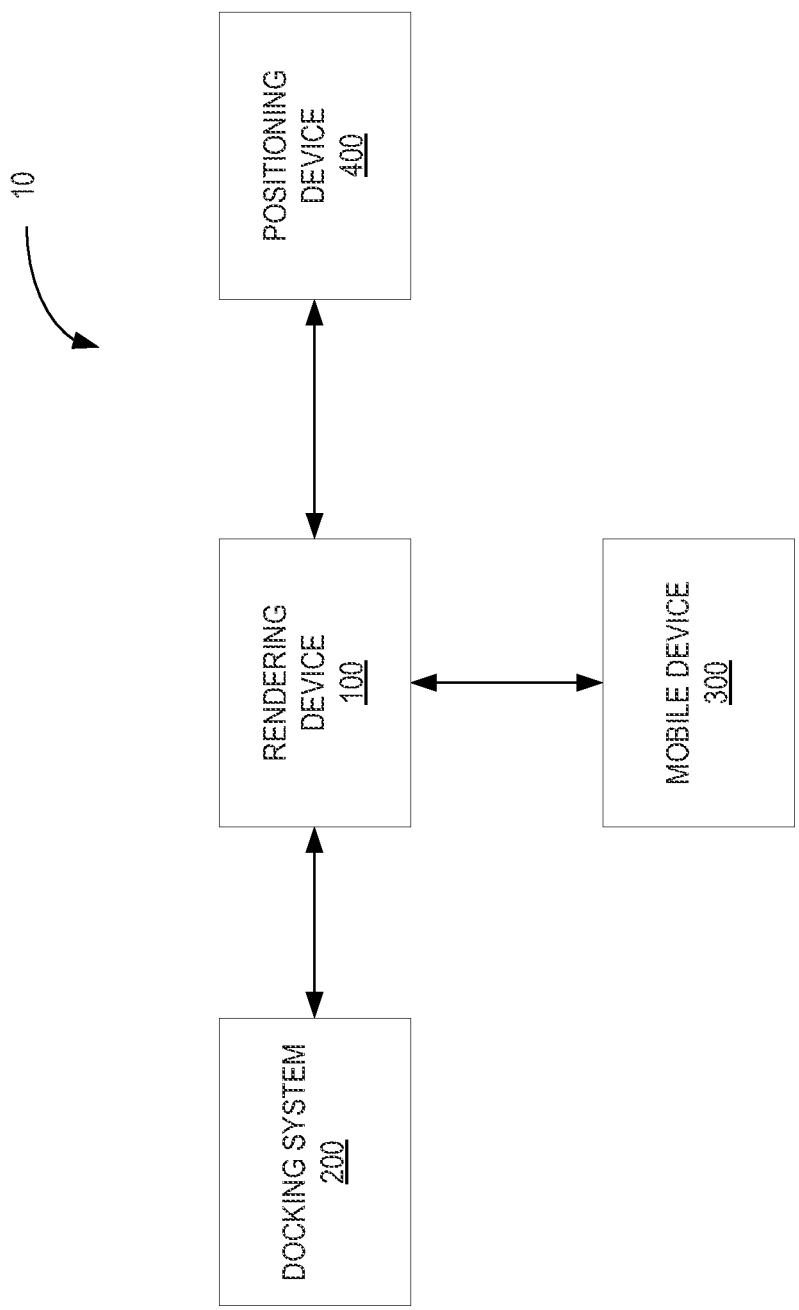
FIG. 1 illustrates a rendering system including a rendering device for rendering media files and mobile device carried by a user.

FIG. 1 illustrates a rendering system 10 according to one exemplary embodiment of the invention. The rendering system 10 comprises four main elements: a rendering device 100, a docking station 200 for the rendering device 100, a mobile device 300 that is carried by a user, and a positioning device 400 for determining a position of the mobile device 300. It is presumed that the mobile device 300 is carried by the user so that the position of the mobile device 300 is the same as the user's position.

The rendering device 100 in the exemplary embodiment comprises a mobile device, such as smart phone, personal digital assistant, tablet computer, or laptop computer. Such devices typically include built-in speakers for outputting sound and a display for outputting visual information. The rendering device 100 may be used, for example, to play back audio and/or video files. As an example, the rendering device 100 may be used to play back music files stored in the memory of the rendering device 100. At the same time, album art and song information may be output to the display. In the exemplary embodiment, the rendering device 100 may be docked with a docking station 200. In this case, the rendering device 100 may output audio signals or images to the docking station 200.

The docking station 200 comprises a dock with a system connector for connecting to the rendering device 100, and speakers for outputting audio. The docking station may also optionally include a display for outputting visual information (e.g. images and text). The system connector enables the rendering device 100 to output audio and/or video signals to the docking station. The system connector also enables the exchange of control signals between the docking station and mobile device. In some embodiments, the docking station 200 may connect to home stereo or video systems, thus allowing audio and video files stored in the rendering device 100 to be played back via the home stereo and/or video system.

The mobile device 300 comprises a handheld wireless communication device, such as a cell phone, smart phone, or personal digital assistant. Such devices are typically carried on a person or kept close at hand. Therefore, embodiments of the present invention presume that the user's location is the same as the mobile device location.

The positioning device 400 monitors the current location or position of the mobile device 300 and determines a distance between the mobile device 300 and rendering device 100. In the embodiment shown in FIG. 1, the positioning device 400 is separate from the rendering device 100. In other embodiments, the positioning device 400 could be integrated with the rendering device 100 or the mobile device 300.

A variety of technologies exist for determining the position of a mobile device 300 in an indoor environment. For example, where the mobile device 300 is equipped with a WiFi transceiver or Bluetooth transceiver, distance to the mobile device 300 can be estimated based on received signal strength (RSS) measurements. These techniques are particularly useful where the positioning device 400 is integrated or co-located with the rendering device 100 or docking system 200.

In scenarios where multiple WiFi or Bluetooth nodes are present, triangulation techniques can be used to determine a position of the mobile device 300 and/or the rendering device 100. For example, the mobile device 300 can transmit a signal that is received at multiple WiFi or Bluetooth nodes. Assuming synchronization between the receiving nodes, the time difference of arrival of the signal at each of the nodes can be used to determine the position of the mobile device 300. The same technique can be used to determine a position of the rendering device 100. Once the positions of the mobile device 300 and rendering device 100 are known, a distance between the two devices can be determined.

In other embodiments of the invention, the positioning device 400 can be integrated with the mobile device 300. Location fingerprinting techniques can be used to determine a location of the mobile device 300 in two dimensions. Again, assuming the position of the rendering device 100 is known, the distance between the mobile device 300 and rendering device 100 can be determined from the position of the mobile device 300.

Because positioning techniques are well known in the art, these techniques are not described in detail. Further, those skilled in the art will appreciate that the particular techniques for determining distance between the mobile device 300 and rendering device 100 are not a material aspect of the invention. Any positioning techniques now known or later developed may be used in practicing the invention described herein.

In operation, the positioning device 400 provides position or distance information to the rendering device 100. The processor 110 in the rendering device continually monitors the distance between the mobile device 300 and the rendering device 100. Depending on the distance, the rendering device 100 can dynamically adapt how a media file is rendered. When the media file includes audio, the rendering device 100 can vary the volume of the audio depending on the distance between the mobile device 300 and rendering device 100 to provide a normalized volume depending on the distance. For example, the volume can be increased or decreased responsive to changes in the distance between the mobile device 300 and rendering device 100. When the media file includes visual information output to a display on the rendering device 100 or docking station 200, the rendering device 100 can adapt the way in which visual information is rendered. For example, the size of images and text can be enlarged or decreased as a function of the distance between the mobile device 300 and rendering device 100. Also, the layout of visual information may be changed to accommodate long-distance viewing.

In some embodiments of the invention, the rendering device 100 may send audio or images to the mobile device 300 when the distance between the mobile device 300 and the rendering device 100 exceeds a predetermined distance, e.g., 15 feet. For example, the audio signals may be sent from the rendering device 100 to the mobile device 300 when the mobile device 300 is more than a predetermined distance away from the rendering device 100. In this case, the audio can then be rendered on the mobile device 300. As the user moves back in range, the rendering device 100 may switch the audio output back to the docking station.

Similarly, images can be transferred via a wireless interface to the mobile device 300 when the mobile device 300 begins to move out of range of the rendering device 100 so that the images can be displayed to the user on a display of the mobile device 300. In this case, the display screen of the rendering device 100 may be turned off in order to conserve power. As the mobile device 300 moves back in range, the rendering device 100 stops sending images to the mobile device 300 and outputs the images to the display of the rendering device 100.

Figure 2:
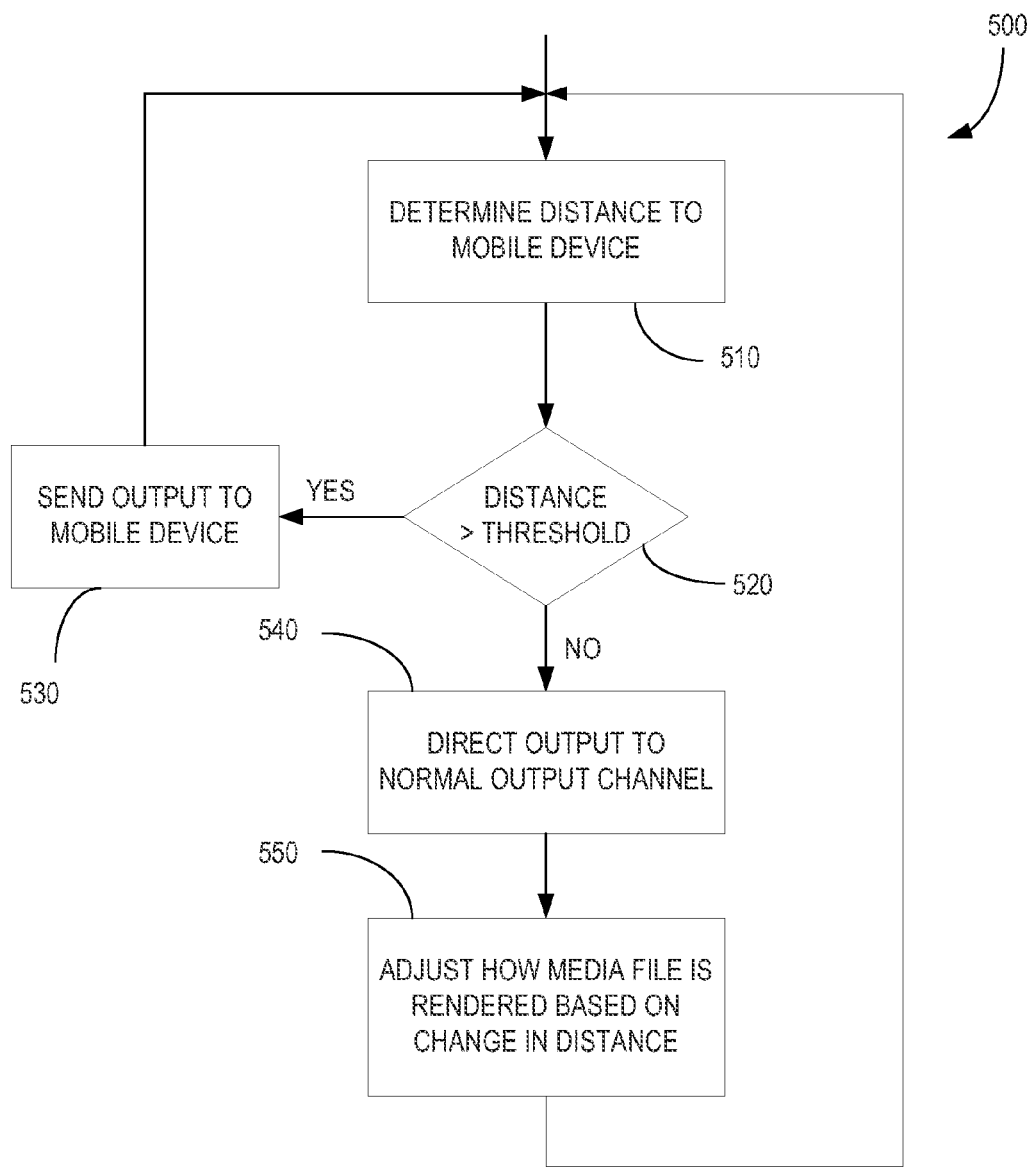
FIG. 2 illustrates an exemplary method implemented by the rendering system for varying how a media file is rendered based on a distance between a rendering device and a mobile device.

FIG. 2 illustrates an exemplary method according to one embodiment of the invention. The method begins when the rendering device 100 starts rendering a media file, e.g. music or video. While the media file is being rendered by the rendering device 100, the rendering device 100 monitors the distance between the rendering device 100 and the mobile device 300 (block 510). As previously indicated, the positioning device 400 may provide the rendering device 100 with the current position of the mobile device 300. The rendering device 100 could then compute the distance to the mobile device 300 based on the position information. Alternatively, the positioning device 400 may compute the distance between the rendering device 100 and mobile device 300, and report the computed distance to the rendering device 100. In either case, the periodic distance measurements are used by the rendering device 100 to detect changes in the distance between the rendering device 100 and the mobile device 300.

In one exemplary embodiment, the rendering device 100 compares the most recent distance measurement to a predetermined distance threshold (block 520). When the distance reaches the threshold, the rendering device may redirect the output to the mobile device 300 (block 530). For example, the audio signals may be sent from the rendering device 100 to the mobile device 300 when the mobile device 300 is more than a predetermined distance away from the rendering device 100. In this case, the audio can then be rendered on the mobile device 300. As the user moves back in range, the rendering device 100 may switch the audio output back to the docking station (block 540).

Similarly, images can be transferred via a wireless interface to the mobile device 300 when the mobile device begins to move out of range of the rendering device 100 so that the images can be displayed to the user on a display of the mobile device 300 (block 530). In this case, the display screen of the rendering device 100 may be turned off in order to conserve power. As the mobile device 300 moves back in range, the rendering device 100 stops sending images to the mobile device 300 and outputs the images to the display of the rendering device 100 (block 540).

Those skilled in the art will appreciate that the operation represented by blocks 520-540 are optional and do not need to be performed in all embodiments.

As the distance between the mobile device 300 and rendering device 100 changes, the rendering device 100 dynamically varies how the media file is rendered (block 550). For example, if the media file includes audio, the rendering device 100 may vary the volume of the audio. If the media files include still images or video images output to a display, the rendering device 100 may vary the size of the image or accompanying text being displayed. Also, the rendering device 100 could vary the zoom level or resolution of the displayed image. This process repeats until the playback of the media file is stopped.

In some embodiments, the media file may comprise web content displayed on a display associated with the rendering device 100. The rendering device 100 may, as previously described, vary the size of text, images, or other visual content contained within the web page. Additionally, the rendering device could also change the layout of visual content displayed on a display depending on the distance.

Figure 3:
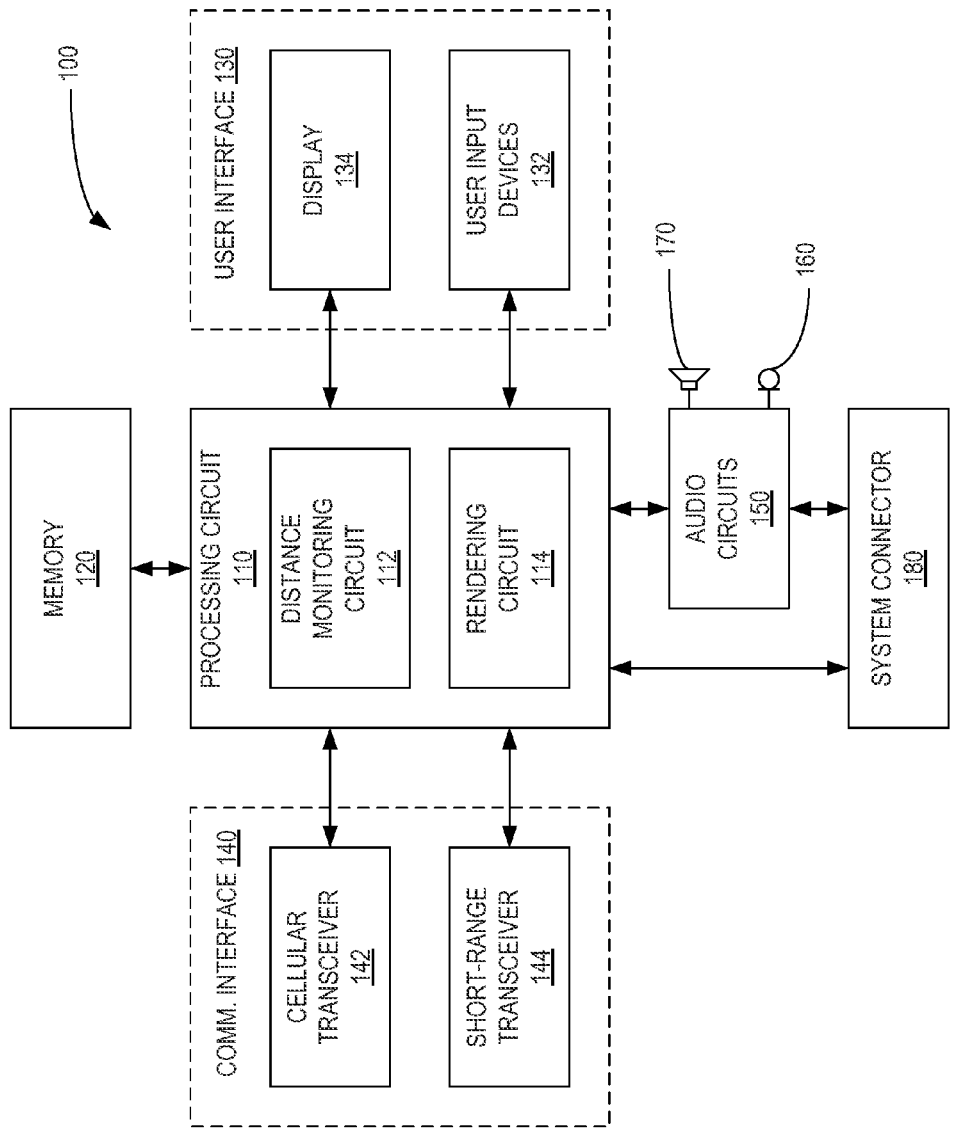
FIG. 3 illustrates an exemplary rendering device for the rendering system.

FIG. 3 illustrates the main functional elements of the rendering device 100. As previously noted, the rendering device 100 may comprise a smart phone, tablet computer, or other mobile device. The rendering device 100 comprises a processing circuit 110, memory 120, a user interface 130, a wireless transceiver 140, audio circuits 150, microphone 160 and speaker 170.

The processing circuit 110 controls the overall operation of the rendering device 100 according to programs stored in memory 120. The control functions may be implemented in one or more microprocessors, hardware, firmware, or a combination thereof. The processing circuit 110 includes a distance monitoring circuit 112 and a rendering circuit 114. The distance monitoring circuit 112 monitors the distance to the mobile device 300 and detects changes in the distance between the rendering device 100 and the mobile device 300. The rendering circuit 114 controls how the media files are rendered based on the distance. As previously noted, the rendering circuit 114 may adjust the volume of audio files are alter the way in which visual information is output.

Memory 120 may include both random access memory (RAM) and read-only memory (ROM). Memory 120 stores program instructions 122 and data required for operation. Memory 120 also stores media files 124 to be rendered by the rendering device 100. Computer program instructions and media files are preferably stored in non-volatile memory, such as EPROM, EEPROM, and/or Flash memory, which may be implemented as discrete devices, stacked devices, or integrated with processor 110.

The user interface 130 includes one or more user input devices 132 and a display 134 to enable the user to interact with and control the rendering device 100. The user input devices 132 may include a keypad, touchpad, joystick control, dials, control buttons, or a combination thereof. Information for viewing by the user can be output to the display 134. The display 134 may comprise a touch screen display, which also functions as an input device 132.

Communication interface 140 comprises one or more wireless transceivers to enable the rendering device 140 to communicate with remote devices. In the exemplary embodiment, the communication interface includes a cellular transceiver, which may operate according to any known standard, including the Global System for Mobile Communications (GSM), Wideband CDMA (WCDMA), and Long Term Evolution (LTE). The communication interface 140 further includes a short-range wireless interface, such as a BLUETOOTH or WiFi interface, to enable the rendering device 100 to communicate over a wireless channel with the mobile device 300 or other nearby devices. For example, the short-range wireless interface can be used to send media files to the mobile device 300 when the mobile device 300 moves away from the rendering device.

Audio circuits 150 receive analog audio inputs from microphone 160 and provide basic analog output signals to speaker 170. Microphone 160 converts the detected speech and other audible signals into electrical audio signals and speaker 170 converts analog audio signals into audible signals that can be heard by the user. The audio circuits can also switch the audio output between the built-in speaker 170 and the system connector 180.

The system connector 180 provides an interface for connecting the rendering device 100 with the docking station 200 or charging station (not shown). The system connector 180 provides electrical connections between the rendering device 100 and the docking station 200 so that audio files and or video files can be output to the docking station 200. The system connector 180 may also provide signaling connections between the rendering device 100 and the docking station 200 for control signaling.

As previously indicated, the mobile device 300 may comprise a smart phone, cell phone, personal digital assistant, or other mobile device with wireless communications capabilities. Such devices are well-known in the art and are therefore not described herein in detail. It is noted that such device typically include a short-range interface (e.g. WiFi or BLUETOOTH) 310 so that the location of the mobile device 300 can be determined. The wireless interface may be used to communicate with the rendering device 100 and/or positioning device 400. Such devices also have a display 320 and speakers 330 capable of rendering media files. Therefore, when the mobile device 300 moves beyond a predetermined range, the media files can be sent to the mobile device 300 by the rendering device via the short-range interface. Thus, the mobile device 300 may serve as an auxiliary rendering device.

The present invention may, of course, be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method of rendering a media file, said method comprising:
    rendering a media file by a rendering device, wherein the media comprises audio and an image;
    monitoring a distance between the rendering device and a mobile device while the media file is being rendered; and
    redirecting the rendering of the media file from the rendering device to the mobile device responsive to detecting that the distance between the rendering device and the mobile device exceeds a predefined distance, wherein the redirecting comprises one or both of:
        outputting the audio of the media file by the rendering device to a speaker on the mobile device; and
        outputting the image of the media file by the rendering device to a display on the mobile device.

2. The method of claim 1 further comprising varying how the media file is rendered by the rendering device by varying a volume of the audio output by a speaker of the rendering device.

3. The method of claim 1 wherein the image comprises a still image, a video image, or text displayed on a display associated with the rendering device, and further comprising varying how the media file is rendered by the rendering device by varying a size of the displayed image.

4. The method of claim 1 wherein the image comprises a still image or video image displayed on a display associated with the rendering device, and further comprising varying how the media file is rendered by the rendering device by varying a zoom level for the displayed image.

5. The method of claim 1 wherein the image comprises a still image or video image displayed on a display associated with the rendering device, and further comprising varying how the media file is rendered by the rendering device by varying a resolution of the displayed image.

6. The method of claim 1 wherein the media file comprises a web page having the image, and is displayed on a display associated with the rendering device, and further comprising varying how the media file is rendered by the rendering device by varying a page layout for the displayed the web page.

7. The method of claim 1 wherein outputting the audio of the media file comprises outputting the audio to a speaker on the mobile device when the distance is greater than a first predetermined distance, and wherein outputting the image of the media file comprises outputting the image to a display on the mobile device when the distance is greater than a second predetermined distance.

8. A rendering device for rendering a media file, said device comprising:
    a display configured to display an image of a media file being rendered by the rendering device;
    a speaker configured to output audio of the media file being rendered by the rendering device;
    a distance monitoring circuit configured to monitor a distance between the rendering device and a mobile device while the media file is being rendered; and
    a rendering circuit configured to:
        render the media file by outputting the image of the media file to the display, and by outputting the audio of the media file to the speaker; and
        redirect the rendering of the media file from the rendering device to the mobile device responsive to detecting that the distance between the rendering device and the mobile device exceeds a predefined distance, wherein to redirect the rendering of the media file, the rendering circuit is configured to redirect one or both of:
            the audio of the media file from the speaker of the rendering device to a speaker on the mobile device; and
            the image of the media file from the display of the rendering device to a display on the mobile device.

9. The rendering device of claim 8 wherein the rendering circuit is further configured to vary a volume of the audio output by the speaker.

10. The rendering device of claim 8 wherein the image comprises a still image, a video image, or text displayed on the display, and wherein the rendering circuit is further configured to vary the size of the displayed image.

11. The rendering device of claim 8 wherein the image comprises a still image or video image displayed on the display, and wherein the rendering circuit is further configured to vary a zoom level for the displayed image.

12. The rendering device of claim 8 wherein the image comprises a still image or video image displayed on the display, and wherein the rendering circuit is further configured to vary a resolution of the displayed image.

13. The rendering device of claim 8 wherein the media file comprises a web page having the image, and is displayed on the display, and wherein the rendering circuit is further configured to vary a page layout for the displayed web page.

14. The rendering device of claim 8 wherein the rendering circuit is configured to:
    output the audio associated with the media file to a speaker on the mobile device when the distance is greater than a first predetermined distance; and output the image associated with the media file to a display on the mobile device when the distance is greater than a second predetermined distance.

\* \* \* \* \*